US009595449B1

United States Patent
Jagannathan et al.

(10) Patent No.: US 9,595,449 B1
(45) Date of Patent: Mar. 14, 2017

(54) SILICON-GERMANIUM SEMICONDUCTOR DEVICES AND METHOD OF MAKING

(71) Applicant: International Business Machines Corporation, Armonk, NY (US)

(72) Inventors: Hemanth Jagannathan, Niskayuna, NY (US); ChoongHyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/976,522

(22) Filed: Dec. 21, 2015

(51) Int. Cl.
*H01L 21/02* (2006.01)
*H01L 21/3105* (2006.01)
*H01L 29/78* (2006.01)
*H01L 29/161* (2006.01)
*H01L 21/324* (2006.01)
*H01L 21/30* (2006.01)
*H01L 29/51* (2006.01)

(52) U.S. Cl.
CPC .... *H01L 21/3105* (2013.01); *H01L 21/02164* (2013.01); *H01L 21/02236* (2013.01); *H01L 21/3003* (2013.01); *H01L 21/324* (2013.01); *H01L 29/161* (2013.01); *H01L 29/513* (2013.01); *H01L 29/517* (2013.01); *H01L 29/78* (2013.01); *H01L 29/518* (2013.01)

(58) Field of Classification Search
CPC ............. H01L 29/66795; H01L 29/785; H01L 29/517; H01L 29/518; H01L 21/823807; H01L 27/0922
See application file for complete search history.

(56) References Cited

U.S. PATENT DOCUMENTS 7,186,600 B2 3/2007 Ohtani et al.
7,282,398 B2 10/2007 Yamazaki et al.
(Continued)

OTHER PUBLICATIONS

Kepa, J., et al., "Comparative analysis of thermally induced degradation of condensation-grown (100)Ge0.75Si0.25/SiO2 interfaces by electron spin resonance"; Applied Surface Science, vol. 291, 2014, pp. 20-24.
(Continued)

*Primary Examiner* — Zandra Smith
*Assistant Examiner* — John M Parker
(74) *Attorney, Agent, or Firm* — Cantor Colburn LLP; Vazken Alexanian

(57) ABSTRACT

Oxidation treatment of a $Si_{1-x}Ge_x$ (0<x<1) substrate forms on the substrate an interfacial layer comprised of silicon oxide and germanium oxide. The presence of germanium oxide in the interfacial layer is deleterious to the quality of the interfacial layer/$Si_{1-x}Ge_x$ conducting channel as evidenced by an increase in charge interface states and a decrease in carrier mobility. Germanium oxide is scavenged from the interfacial layer in a scavenging step comprising heating the interfacial layer/substrate in a hydrogen-containing reducing atmosphere at a temperature of from about 450° C. to about 800° C. to reduce the germanium oxide content of the interfacial layer to not more than about 10% by weight, for example, not more than about 1% by weight, of the weight of the scavenged interfacial layer.

20 Claims, 3 Drawing Sheets

(56) References Cited

U.S. PATENT DOCUMENTS

| | | | |
|---|---|---|---|
| 7,495,313 B2 | 2/2009 | Nayfeh et al. | |
| 8,878,302 B2 | 11/2014 | Cheng et al. | |
| 8,952,460 B2 | 2/2015 | Brodsky et al. | |
| 9,105,745 B2 | 8/2015 | Ando et al. | |
| 2002/0142500 A1 | 10/2002 | Foglietti et al. | |
| 2010/0200897 A1 | 8/2010 | Heringa et al. | |
| 2012/0270393 A1* | 10/2012 | Pore | C23C 16/06 438/658 |
| 2013/0344248 A1* | 12/2013 | Clark | C23C 16/34 427/255.393 |
| 2014/0242788 A1* | 8/2014 | Dilliway | H01L 21/28255 438/590 |
| 2014/0264281 A1* | 9/2014 | Niyogi | H01L 29/778 257/29 |
| 2014/0273493 A1* | 9/2014 | Limdulpaiboon | H01L 29/778 438/723 |
| 2014/0342575 A1 | 11/2014 | Ito et al. | |
| 2015/0249009 A1* | 9/2015 | Tapily | H01L 21/02315 438/585 |

OTHER PUBLICATIONS

Nayfeh, Ammar, et al., "Fabrication of High-Quality p-MOSFET in Ge Grown Heteroepitaxially on Si", IEEE Electron Device Letters, vol. 26, No. 5, May 2005, pp. 311-313.

Wang, Sheng Kai, et al., "Desorption kinetics of GeO from GeO2/Ge structure", Journal of Applied Physics, vol. 108, 054104 (2010), pp. 054104-1-054104-8.

\* cited by examiner

SILICON-GERMANIUM SEMICONDUCTOR DEVICES AND METHOD OF MAKING

BACKGROUND

The present invention relates to a method of making a silicon-germanium semiconductor device comprising a silicon-germanium substrate having a refined interfacial layer thereon, and to devices made by the method.

Complementary metal oxide semiconductor (CMOS) fabrication is used for constructing integrated circuits. CMOS technology is used in microprocessors, microcontrollers, static RAM, and other digital logic circuits. CMOS designs may use complementary and symmetrical pairs of p-type (pFET) and n-type (nFET) metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

SUMMARY

In accordance with one embodiment of the present invention there is provided a method of refining a mixed silicon oxide-germanium oxide interfacial layer of a silicon-germanium transistor substrate. The method comprises contacting (i) hydrogen and (ii) the silicon-germanium transistor substrate at a temperature, pressure, and length of time sufficient to scavenge germanium oxide from the mixed silicon oxide-germanium oxide interfacial layer of the silicon-germanium transistor substrate.

Another aspect of the present invention provides an improvement to a method of making a semiconductor device comprising a silicon-germanium substrate having thereon a silicon oxide-containing interfacial layer formed by oxidizing the silicon-germanium substrate in an oxidation step. The improvement comprises scavenging germanium oxide from the interfacial layer after the oxidation step, by heating the device at a temperature of from about 450° C. to about 800° C. in a reducing atmosphere having a hydrogen partial pressure of from about 0.1 Torr to about 15,200 Torr. The germanium oxide content of the interfacial layer is reduced to not more than about 10% by weight of the interfacial layer remaining after the scavenging step.

Other aspects of the present invention provide a semiconductor device made in accordance with the aforesaid methods.

DETAILED DESCRIPTION

Figure 1:
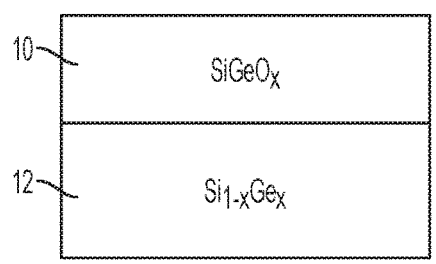
FIG. 1 is a schematic view in cross section showing a stage in the manufacture of a refined interfacial layer overlying a silicon-germanium semiconductor substrate in accordance with an aspect of the present invention.

Thin oxide interfacial layers are formed on silicon-germanium ($Si_{1-x}Ge_x$, $0<x<1$) substrates by oxidizing the substrate to provide an interfacial layer on the channel layer of a semiconductor device. The semiconductor devices described herein may be any type of device. Exemplary types of semiconductor devices include planar field effect transistors (FETs), fin-type field effect transistors (FinFETs), nanowire/nanosheet devices, vertical field effect transistors (VFETs), or other devices.

The silicon-germanium substrates may be formed as a layer on another supporting substrate. For example, a layer of silicon germanium may be formed on a silicon substrate or wafer. The supporting substrate may also include one or more semiconductor materials.

Non-limiting examples of suitable supporting substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The supporting substrate may be a silicon-germanium on insulator substrate (SGOI) with one or more buried dielectric layers. The buried dielectric layers may include, for example, a dielectric material such as silicon dioxide.

The silicon-germanium layer may be formed on the supporting substrate by, for example, depositing one or more layers of germanium and/or silicon onto the silicon substrate. An epitaxial growth process is performed to deposit a crystalline layer onto a crystalline substrate beneath. Epitaxial layers may be grown from gaseous or liquid precursors.

The epitaxial silicon, epitaxial germanium, and epitaxial silicon germanium can be doped during deposition by adding a dopant or impurity. The dopant may be an n-type dopant (e.g., phosphorus or arsenic) or a p-type dopant (e.g., boron or gallium), depending on the type of transistor.

The epitaxial layers may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

A number of different sources may be used for the deposition of the silicon germanium layer. In some embodiments, the gas source for the deposition of epitaxial silicon germanium includes a silicon containing gas source, a germanium containing gas source, or a combination thereof.

For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

After depositing the one or more layers of silicon, germanium, or silicon germanium, a thermal mixing process may be performed to form the final desired silicon germanium layer or silicon germanium substrate.

The germanium content of the silicon-germanium substrate may generally vary. The substrate may have an atomic germanium content of from about 25% to about 75% according to some embodiments. In another embodiment, the atomic germanium content may be, e.g., up to about 95%, or from about 75% to about 95%.

The silicon-germanium substrate may have a constant atomic germanium content in a given layer. Alternatively, the silicon-germanium substrate may have an increasing atomic gradient of germanium content.

The oxidation step may be carried out by any suitable oxidation techniques. Non-limiting examples of oxidation techniques include thermal or chemical oxidation, plasma oxidation, ozonated deionized water treatment, or the like.

After oxidizing the silicon-germanium substrate, a thin interfacial layer is formed on a surface of the silicon-germanium substrate. The resulting thin interfacial layer is comprised of silicon oxide and germanium oxide.

The proportion of germanium oxide in the interfacial layer resulting from the oxidation treatment is highly dependent on the germanium content in the $Si_{1-x}Ge_x$ substrate. The higher is the germanium content in the silicon-germanium substrate, the higher is the germanium oxide content of the interfacial layer. The lower the germanium content in the silicon-germanium substrate, the lower the germanium oxide content of the interfacial layer.

Germanium oxide is harmful to the quality of the interfacial layer formed on the $Si_{1-x}Ge_x$ channel. The harm to the channel is evidenced by the increase in charged interface states. The harm to the channel is also evidenced by the decrease in mobility with increasing amounts of germanium oxide in the interfacial layer.

Figure 2:
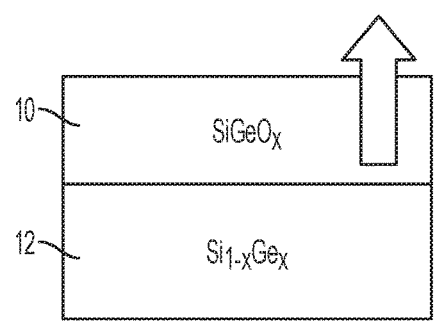
FIG. 2 is a schematic view in cross section showing a stage following FIG. 1 in the manufacture of a refined interfacial layer overlying a silicon-germanium semiconductor substrate in accordance with an aspect of the present invention.
Figure 3:
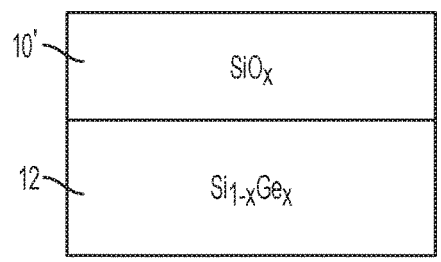
FIG. 3 is a schematic view in cross section showing a stage following FIG. 2 in the manufacture of a refined interfacial layer overlying a silicon-germanium semiconductor substrate in accordance with an aspect of the present invention.

Accordingly, described herein are methods to scavenge or remove the germanium oxide from an interfacial layer comprising germanium oxide and silicon oxide that is formed on a silicon-germanium substrate. In some embodiments, the germanium oxide is substantially removed from the interfacial layer, leaving silicon oxide remaining. In other embodiments, after a scavenging step, the residual germanium oxide is less than 10%, for example, less than 1%, by weight of the interfacial layer FIGS. 1-3 schematically show steps in scavenging germanium oxide from the interfacial layer 10 of a silicon-germanium substrate 12 ($Si_{1-x}Ge_x$) wherein x is greater than 0 and less than 1. In some embodiments, x is 0.1, 0.2, 0.3, 0.4, 0.5, 0.6, 0.7, 0.8, or 0.9. As described above, the silicon-germanium substrate 12 may be a layer disposed on another support substrate. The silicon-germanium substrate 12 may form a channel region in a transistor.

FIG. 2 indicates by the unnumbered arrow the removal of germanium oxide from interfacial layer 10 by the scavenging step described below. The scavenging step is carried out by heating the substrate at a temperature of from about 450° C. to about 800° C. in a reducing atmosphere having a hydrogen partial pressure of from about 0.1 Torr to about 15,200 Torr.

FIG. 3 shows a germanium oxide-depleted interfacial layer 10' that results after removing the germanium oxide from the interfacial layer 10. In some embodiments, the germanium oxide-depleted interfacial layer 10' may be substantially depleted of germanium oxide. In other embodiments, the germanium oxide-depleted interfacial layer 10' have a residual germanium oxide content of not more than about 10%, by weight of the weight of interfacial layer 10' after the scavenging step is completed. For example, the residual germanium oxide content may be 10% or less, or about or in any range from about 1, 2, 3, 4, 5, 6, 7, 8, 9 or 10%, by weight of the interfacial layer 10' after the scavenging step is completed.

The interfacial layer 10 generally has a thickness of from about 0.1 to about 1 nanometer. The interfacial layer provides insulation between the substrate conducting channel and the metal gate, while maintaining desired small dimensions of the device. Although, the thickness of the interfacial layer 10 may generally vary.

The scavenging step reduces the germanium oxide content of the interfacial layer 10 formed on the substrate. The scavenging step may be carried out to reduce the germanium oxide content to not more than about 10% by weight. In some cases, the scavenging step reduces the germanium oxide content to not more than about 1% by weight, of the total weight of the interfacial layer remaining after the scavenging step.

Such reduction of the germanium oxide content of the scavenged interfacial layer reduces charged surface interface states. Reduction of the germanium oxide content also enhances mobility in the conducting channel layer of the substrate.

The scavenging step is effective because the germanium-oxygen bond in germanium oxide is much weaker than both the silicon-oxygen bond in silicon oxide and the silicon-germanium bond in the substrate. Accordingly, germanium oxide is easily removed, leaving silicon oxide remaining within the interfacial layer on the substrate.

After the scavenging step, the interfacial layer comprises from about 30% to about 50% by weight silicon and from about 50% to about 70% by weight oxygen. The residual germanium does not exceed about 10% by weight, measured as $GeO_2$.

The scavenging step is carried out for a time period of from about 1 to about 15 minutes. For example, the scavenging step may be carried out for about 3 to about 7 minutes.

The scavenging temperature is from about 450° C. to about 800° C. For example, the scavenging temperature may be about 500° C. to about 700° C. Alternatively, the scavenging temperature may be from about 550° C. to about 750° C. The scavenging temperature depends on the germanium content of the substrate.

Figure 4:
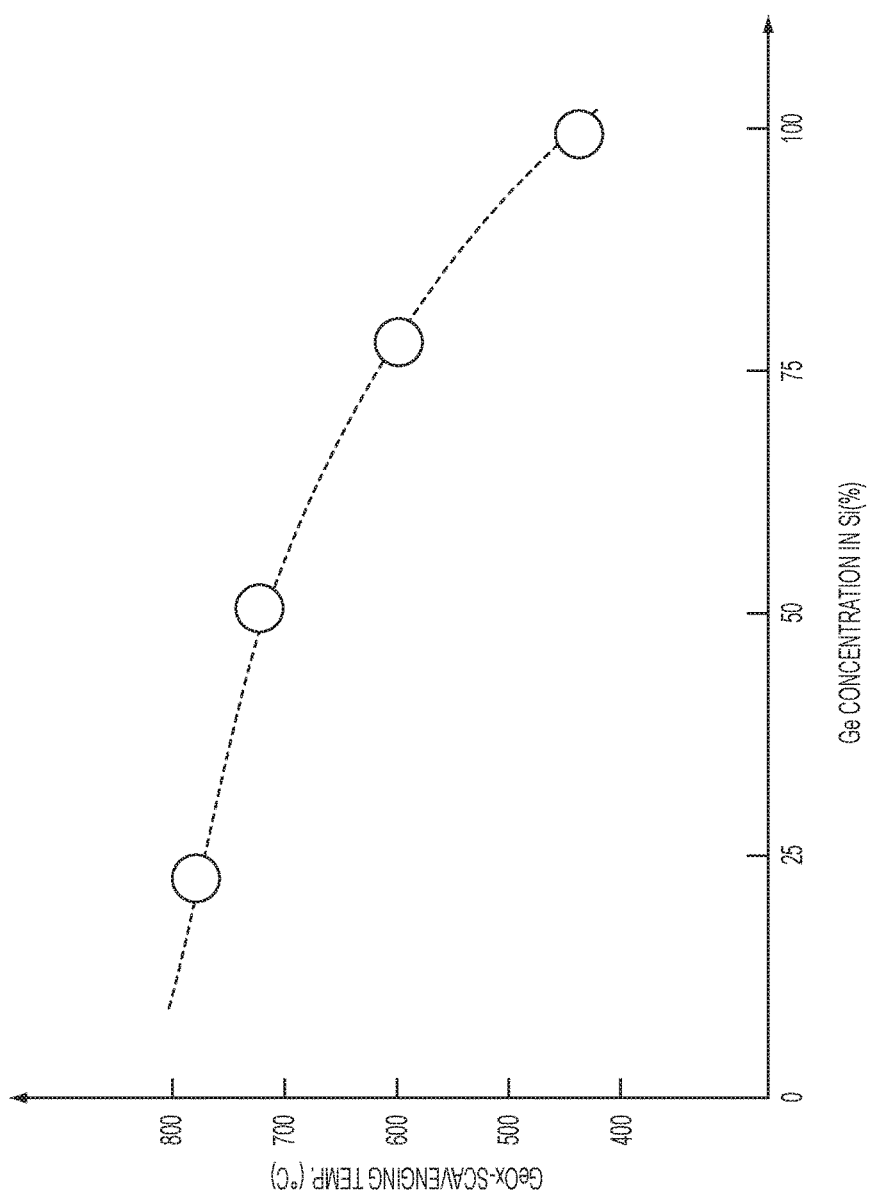
FIG. 4 is a graph plotting temperatures at which the scavenging step is carried out against the germanium content of a silicon-germanium substrate.

FIG. 4 shows the germanium oxide scavenging temperatures which provide efficient scavenging of germanium oxide from the interfacial layer, relative to the proportion of germanium to silicon in the substrate on which the interfacial layer is formed. The proportion of germanium in the substrate is expressed as the percentage atomic concentration of germanium in silicon.

At very high germanium concentrations, a lower scavenging temperature suffices to satisfactorily scavenge germanium oxide from the interfacial layer. For example, at about 95% atomic concentration of germanium, a scavenging temperature of about 450° C. will suffice, whereas at a germanium atomic concentration of about 10% a scavenging temperature of about 800° C. provides efficient scavenging.

The reducing atmosphere used for the scavenging step may comprise hydrogen or it may comprise hydrogen and an inert gas. The inert gas may be, for example, one or more of nitrogen, argon, helium and the like. The scavenging step may be carried out prior to or right after the application of a high-k dielectric layer over at least a portion of the interfacial layer. The high-k dielectric layer high-k dielectric material(s) can be a dielectric material having a dielectric constant, for example, greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used.

In an exemplary embodiment, the high-k dielectric material includes hafnium oxide, hafnium silicate, zirconium oxide, zirconium silicate, alumina and aluminum silicate. A high-k dielectric layer may have a thickness of up to about 3 nanometers.

The scavenging may also be carried out later in the manufacturing process, e.g., during reliability annealing. The germanium oxide can be scavenged through the high-k dielectric layer.

Example

This Example shows effective scavenging temperature ranges for interfacial layers formed on substrates having different atomic ratios of silicon to germanium. The Example is based on experiments conducted over a wide range of hydrogen partial pressures. These temperature ranges are effective to reduce the germanium oxide content of the interfacial layer to not more than about 1% by weight (measured as $GeO_2$) of the weight of the scavenged interfacial layer.

The hydrogen partial pressures ranged from about 0.1 Torr to about 15, 200 Torr (20 atmospheres) and the time of scavenging is about 1 to 5 minutes, for example, in any range from about 1, 2, 3 or 4 to about 5 minutes.

TABLE

| Substrate Atomic Ratio | | Scavenging Temperature |
|---|---|---|
| % Si | % Ge | ° C. |
| 75 | 25 | 700-800 |
| 60 | 40 | 600-700 |
| 50 | 50 | 550-650 |
| 25 | 75 | 500-600 |

Generally, the temperature, hydrogen pressure or hydrogen partial pressure, and time of the scavenging step are selected to reduce the germanium oxide content in the interfacial layer to the desired level. It has been found that in most cases a scavenging time of about one minute at the indicated temperature range suffices to reach the target residual germanium oxide content. However, as a practical matter somewhat longer scavenging times, of up to about five minutes, e.g., any suitable range lying within about 1 to about 5 minutes, have been employed to ensure adequate scavenging. Longer scavenging times from about 5 to about 15 minutes do not appear to be necessary to enhance the desired result. If a somewhat higher content of germanium oxide in the interfacial layer, not more than about 10% by weight of the weight of the scavenged interfacial layer, is tolerable, the temperature ranges in the above table may be reduced by about 100° C. while other conditions remain constant. For example, an interfacial layer formed by oxidation of a substrate having a silicon-to-germanium atomic ratio of 75 to 25 subjected to a scavenging temperature of 600° C. to 700° C. will show a residual germanium oxide content in the interfacial layer of approximately, but not more than, about 10% by weight. (All references in this specification and claims to the percentage by weight of residual germanium oxide in the scavenged interfacial layer are on the basis of percent of the weight of the scavenged interfacial layer, with the germanium oxide measured as $GeO_2$.) Generally, technical requirements of a given product and manufacturing requirements will dictate the residual amount of germanium oxide in the interfacial layer, at a value from not more than 1% by weight, including being substantially free of germanium oxide, to not more than 10% by weight of the scavenged interfacial layer.

Figure 5:
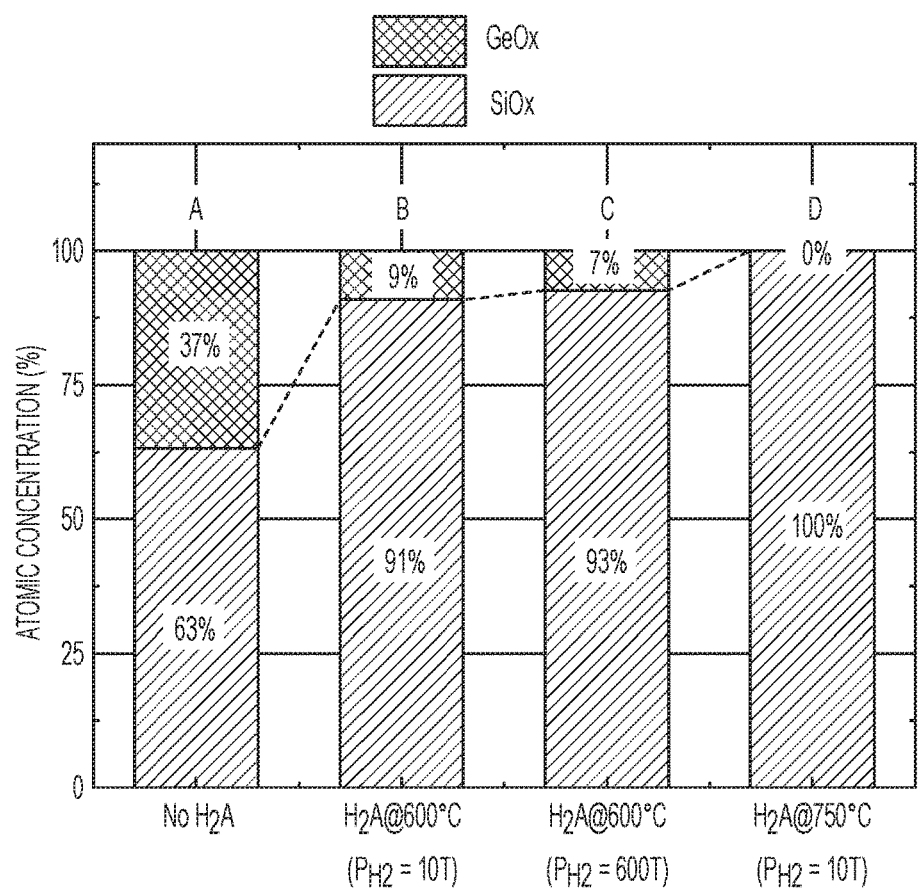
FIG. 5 is a bar graph comparing the atomic concentrations of germanium oxide and silicon oxide in interfacial layers treated, respectively, with and without procedures in accordance with an embodiment of the present invention.

FIG. 5 shows a bar graph comparing the percentage atomic concentration of germanium oxide and silicon oxide in four otherwise identical interfacial layers, three of which are subjected to a hydrogen anneal scavenging step in accordance with an embodiment of the present invention, and one of which is not. In each case, the interfacial layers were formed by treatment with ozonated deionized water.

Bar A of FIG. 5 shows the composition of the interfacial layer which was not subjected to the scavenging step. Bars B, C and D show the compositions of interfacial layers which were subjected to hydrogen anneal ("$H_2A$") scavenging steps carried out at the temperatures and hydrogen partial pressures indicated in the graph, each for a period of five minutes.

It is seen that the interfacial layer of bar A has an atomic concentration of 37% germanium oxide and 63% silicon oxide. Bar B shows that the interfacial layer treated with a hydrogen anneal ("$H_2A$") at 600° C. and a hydrogen partial pressure ("$P_{H2}$") of 10 Torr reduced the germanium oxide percentage to 9%. Treatment with a hydrogen anneal at the same 600° C. temperature but a hydrogen partial pressure of 600 Torr reduced the germanium oxide percentage to about 7% atomic concentration of silicon dioxide (bar C). Treatment with a hydrogen anneal at 750° C. and a hydrogen partial pressure of 10 Torr provided a substantially germanium oxide-free interfacial layer (bar D).

The duration of scavenging treatment for each of the time interfacial layers represented by bars B, C and D is five minutes. A sixty-fold increase in hydrogen partial pressure (bar B to bar C) reduced the germanium content only slightly, from 9% to 7%.

On the other hand, an increase of scavenging temperature from 600° C. to 750° C. (bar D) substantially eliminated germanium oxide from the interfacial layer at the same hydrogen partial pressure at which the 600° C. temperature (bar B) resulted in 9% residual germanium oxide content.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the present invention. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of refining a mixed silicon oxide-germanium oxide interfacial layer of a silicon-germanium transistor substrate, the method comprising:
    contacting (i) hydrogen and (ii) the silicon-germanium transistor substrate at a temperature, pressure, and length of time sufficient to scavenge germanium oxide from the mixed silicon oxide-germanium oxide interfacial layer of the silicon-germanium transistor substrate, leaving silicon oxide remaining; wherein
    the contacting is carried out at a temperature from about 450° C. to about 800° C. in a reducing atmosphere having a hydrogen partial pressure of from about 0.1 Torr to about 15,200 Torr.

2. The method of claim 1 wherein the hydrogen partial pressure is from about 10 Torr to about 600 Torr.

3. The method of claim 1 wherein the interfacial layer has a thickness after the scavenging step of from about 0.1 nanometer to about 1 nanometer.

4. The method of claim 1 wherein the substrate has an atomic germanium content of from about 20% to about 95%.

5. The method of claim 1 wherein the scavenging step reduces the residual germanium oxide content of the interfacial layer to not more than about 10% by weight of the total weight of the interfacial layer remaining after the scavenging step.

6. The method of claim 5 wherein the residual germanium oxide content of the interfacial layer is not more than about 1% by weight of the total weight of the interfacial layer.

7. The method of claim 1 wherein after the scavenging step the interfacial layer comprises from about 30% to about 50% by weight silicon and from about 50% to about 70% by weight oxygen.

8. The method of claim 1 wherein the scavenging step is carried out for a time period of from about 1 to about 15 minutes.

9. The method of claim 1 wherein the reducing atmosphere comprises hydrogen.

10. The method of claim 1 wherein the reducing atmosphere comprises hydrogen and, optionally, an inert gas selected from the class consisting of one or more of nitrogen and argon.

11. The method of claim 10 wherein the hydrogen comprises from about 3 volume % to about 20 volume % of the reducing atmosphere.

12. The method of claim 1 wherein the scavenging step is carried out after the application of a high-k dielectric layer over at least a portion of the interfacial layer.

13. The method of claim 12 wherein the high-k dielectric layer is selected from the class consisting of hafnium oxide, hafnium silicate, zirconium oxide, zirconium silicate, alumina and aluminum silicate, and has a thickness of up to about 3 nanometers.

14. A semiconductor device comprising a silicon-germanium substrate having thereon a silicon oxide interfacial layer made by the method of claim 1.

15. In a method of making a semiconductor device comprising a silicon-germanium substrate having thereon a silicon oxide-containing interfacial layer formed by oxidizing the silicon-germanium substrate in an oxidation step, the improvement comprising, after the oxidation step:
    scavenging germanium oxide from the interfacial layer, leaving silicon oxide remaining;
    wherein scavenging germanium oxide is performed by heating the device at a temperature of from about 450° C. to about 800° C. in a reducing atmosphere having a hydrogen partial pressure of from about 0.1 Torr to about 15,200 Torr to reduce the germanium oxide content of the interfacial layer to not more than about 10% by weight of the interfacial layer remaining after the scavenging step.

16. The method of claim 15 wherein the improvement further comprises applying a high-k dielectric layer to at least a portion of the interfacial layer prior to carrying out the scavenging step.

17. The method of claim 15 wherein the improvement further comprises conducting the scavenging step for a period of from about 1 to about 15 minutes.

18. The method of claim 15 wherein the reducing atmosphere comprises hydrogen and, optionally, an inert gas selected from the class consisting of one or more of nitrogen, argon and helium.

19. The method of claim 18 wherein the hydrogen comprises from about 3 volume % to about 20 volume % of the reducing atmosphere.

20. A semiconductor device comprising a silicon-germanium substrate having thereon a silicon oxide interfacial layer made by the method of claim 15.

* * * * *